(12) United States Patent
Boerner et al.

(10) Patent No.: US 9,196,874 B2
(45) Date of Patent: Nov. 24, 2015

(54) STRUCTURING OF OLEDS USING STACK MODIFICATION LAYER COMPRISING PERFLUORINATED VACUUM GREASE AND/OR PERFLUORINATED VACUUM PUMP OIL

(71) Applicant: KONINKLIJKE PHILIPS N.V., Eindhoven (NL)

(72) Inventors: Herbert Friedrich Boerner, Aachen (DE); Helga Hummel, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/355,006

(22) PCT Filed: Oct. 24, 2012

(86) PCT No.: PCT/IB2012/055853
§ 371 (c)(1),
(2) Date: Apr. 29, 2014

(87) PCT Pub. No.: WO2013/064941
PCT Pub. Date: May 10, 2013

(65) Prior Publication Data
US 2014/0367665 A1   Dec. 18, 2014

Related U.S. Application Data

(60) Provisional application No. 61/555,019, filed on Nov. 3, 2011.

(51) Int. Cl.
| | | |
|---|---|---|
| *H01L 29/08* | (2006.01) | |
| *H01L 35/24* | (2006.01) | |
| *H01L 51/00* | (2006.01) | |
| *H01L 21/66* | (2006.01) | |
| *H01L 51/40* | (2006.01) | |
| *H01J 1/62* | (2006.01) | |
| *H01J 63/04* | (2006.01) | |
| *H01L 51/56* | (2006.01) | |
| *H01L 51/52* | (2006.01) | |
| *H01L 27/32* | (2006.01) | |

(52) U.S. Cl.
CPC ............ *H01L 51/56* (2013.01); *H01L 27/3241* (2013.01); *H01L 27/3283* (2013.01); *H01L51/5203* (2013.01); *H01L 51/524* (2013.01); *H01L 27/3281* (2013.01); *H01L 2251/566* (2013.01)

(58) Field of Classification Search
None
See application file for complete search history.

(56) References Cited

U.S. PATENT DOCUMENTS

| | | |
|---|---|---|
| 5,505,985 A | 4/1996 | Nakamura et al. |
| 5,952,037 A | 9/1999 | Nagayama et al. |
| 6,087,772 A | 7/2000 | Ootsuki et al. |
| 2003/0089252 A1 | 5/2003 | Sarnecki |
| 2003/0098946 A1 | 5/2003 | Blaessing et al. |
| 2005/0051770 A1* | 3/2005 | Ando et al. ............. 257/40 |
| 2009/0195152 A1* | 8/2009 | Sawano ................. 313/504 |
| 2010/0155496 A1 | 6/2010 | Stark et al. |

FOREIGN PATENT DOCUMENTS

| | | |
|---|---|---|
| JP | H10074582 A | 3/1998 |
| WO | 2009029045 A1 | 3/2009 |

OTHER PUBLICATIONS

"Free Margin Oil Evaporator", Technology Detailed Information, Capacitor Technology, Leybold Optics, pp. 1-3. www.leyboldoptics.com.

"Pattern Printing System", Technology Detailed Information, Capacitor Technology, Leybold Optics, pp. 1-3. www.leyboldoptics.com.

* cited by examiner

*Primary Examiner* — Michael Jung
(74) *Attorney, Agent, or Firm* — Yuliya Mathis

(57) ABSTRACT

The invention relates to a method for manufacturing structured organic electroluminescent light-emitting devices (OLEDs) comprising light-emitting and non-emitting areas and to OLEDs manufactured according to this method comprising the steps of: Providing (P) a substrate (2) covered at least locally with at least one conductive layer as the first electrode (3); Depositing (D-SML) a stack modification layer (4) locally on top of the first electrode (3) to establish first areas (31) covered with the stack modification layer (4) and non-covered second areas (32) adjacent to the first areas (31) forming the desired structured pattern; —Depositing (D-OLS) the organic layer stack (5) comprising at least one organic light-emitting layer (51) on top of the first electrode (3) locally coated with the stack modification layer (4) providing an organic layer stack (5) being separated from the first electrode (3) by the stack modification layer (4) in between the organic layer stack (5) and the first electrode (3) in the first areas (31) and being in direct electrical contract to the first electrode (3) in the second areas (32); and Depositing (D-SE) a conductive metal layer as the second electrode (6) on top of the organic layer stack (5) to finish a functional layer stack (7), wherein the first areas (31) above the stack modification layer (4) remain free of the conductive metal without masking these first areas (31); —Providing an easy, variable and reliable method of a maskless structuring of the functional layer stack of OLED enabling to maintain the same the same deposition processes for the functional layer stack as applied during mask processing.

11 Claims, 4 Drawing Sheets

STRUCTURING OF OLEDS USING STACK MODIFICATION LAYER COMPRISING PERFLUORINATED VACUUM GREASE AND/OR PERFLUORINATED VACUUM PUMP OIL

CROSS-REFERENCE TO PRIOR APPLICATIONS

This application is the U.S. National Phase application under 35 U.S.C. §371 of International Application No. PCT/IB2012/055853, filed on Oct. 24, 2012, which claims the benefit of U.S. Provisional Patent Application No. 61/555,019, filed on Nov. 3, 2011. These applications are hereby incorporated by reference herein.

FIELD OF THE INVENTION

The invention relates to a method for manufacturing structured organic electroluminescent light-emitting devices (OLEDs) comprising light-emitting and non-emitting areas and to OLEDs manufactured according to this method.

BACKGROUND OF THE INVENTION

Standard OLEDs nowadays comprise an organic layer stack with at least one organic light-emitting layer arranged between two electrodes deposited on top of a substrate, typically a glass substrate, applying thin film deposition techniques. The layers between the two electrodes and the electrodes form an organic layer stack of thin layers with thicknesses in the order of several tens of nanometer to hundreds of nanometers. Together with the two electrodes, the stack of layers is denoted as functional layers stack in the following. Two different types of OLEDs can be distinguished with respect to the direction of light emission. In the so-called bottom emitters, the light leaves the OLED device through a transparent bottom electrode (usually the anode, usually made of indium-tin-oxide (ITO)) and a transparent substrate (e.g. glass) while the second electrode (typically the cathode made of aluminum) is reflective. In so-called top emitters the light leaves the OLED device through a transparent top electrode (e.g. ITO) and a transparent cover lid (e.g. glass), while a bottom electrode (e.g. aluminum or ITO in case of a reflective substrate) and/or the substrate is reflective. The cover lid is mandatory for these OLEDs in order to prevent the environment, especially moisture and oxygen, from reaching the organic layer stack. The bottom-emitting OLEDs are commonly used for illumination purposes. So-called transparent OLEDs are a combination of a bottom-emitter and a top-emitter having a transparent substrate and a transparent cover lid.

The functional layer stacks on top of a substrate required to generate light from an organic light emitting layer have to be shaped to serve different purposes like enabling electrical contacting of the electrodes, applying certain operating schemes to the functional layer stack, attaching cover lids to enclose the functional layer stack and/or to shape the light-emitting area in order to provide desired visual effects. A common way to structure OLED, especially the functional layer stack, is to apply shadow masks during the thin film deposition, e.g. evaporation. Shadow masks provide the possibility to process the functional layer stack inline depositing one layer after the other. The areas shielded by the shadow masks are not coated with the evaporated materials due to the shadowing effect of the mask resulting in a structured functional layer stack only present in non-masked areas of the substrate. In some cases, a particular designed mask is required for each layer during deposition. One major disadvantage of shadow masks is the need of one mask for each different pattern of masked areas resulting in a large number of required masks for manufacturing OLEDs with a varying pattern of non-emitting areas. This large number of masks makes the mask process very expensive. Another disadvantage of utilizing shadow masks is the limitation to shielded areas, which cannot be fully enclosed by deposited material. The shielding mask areas must be connected to the carrying mask frame resulting in an at least one small non-coated corridor across the OLED light emitting area.

The patent application US 2010/0155496 A1 discloses electrostatic spraying of a liquid from a tube on top of a substrate as an alternative maskless process to manufacture OLEDs. This technique is limited to organic polymers, which is not the preferred light emitting material for OLEDs. Small organic molecules as the organic material deliver the best OLED performance, but they have to be evaporated. It would be desirable to apply a structuring method avoiding shadow masks but enabling to apply the common, reliable manufacturing steps for OLEDs in an non-disturbed way enabling the use of well proven materials.

SUMMARY OF THE INVENTION

It is an object of the invention to provide an easy, flexible and reliable method enabling a maskless structuring of the functional layer stack of OLED to provide OLEDs comprising non-emitting areas within the light-emitting area of the OLEDs while maintaining the same deposition processes for the functional layer stack as applied during mask processing.

This object is achieved by a method for manufacturing an organic electroluminescent light-emitting device with structured pattern of light-emitting and non-emitting areas comprising the steps of:

Providing a substrate covered at least locally with at least one conductive layer as the first electrode;

Depositing a stack modification layer locally on top of the first electrode to establish first areas covered with the stack modification layer and non-covered second areas adjacent to the first areas forming the desired structured pattern;

Depositing the organic layer stack comprising at least one organic light-emitting layer on top of the first electrode locally coated with the stack modification layer providing an organic layer stack being separated from the first electrode by the stack modification layer in between the organic layer stack and the first electrode in the first areas and being in direct electrical contract to the first electrode in the second areas; and Depositing a conductive metal layer as the second electrode on top of the organic layer stack to finish a functional layer stack, wherein the first areas above the stack modification layer remain free of the conductive metal without masking these first areas.

A maskless structuring of the functional layer stack of OLED to provide OLEDs or arrays of OLEDs comprising non-emitting areas between the light-emitting areas of the OLEDs is achieved by depositing the second electrode on top of an organic layer stack having a layer of a stack modification layer underneath. The stack modification layer provides the effect, that the material for the second electrode does not stick to the surface of the upper organic layer (de-wetting effect) during depositing the second electrode material on top of the organic layer stack, e.g. by vacuum evaporation within the first areas. The area above the first area covered with the stack modification layer remains free of at least any second electrode material resulting in a second electrode only present above the second areas that are free of the stack modification layer. The first areas are non-emitting areas, which are prepared by applying the stack modification layer locally to the first electrode not requiring any further structuring process to prepare a certain shape of electrodes and/or organic layer stacks, even not requiring any shadow-mask to structure the functional layer stack to yield non-emitting areas. Due to the use of stack modification layers having a desired area pattern between the organic layer stack and the first electrode, non-emitting areas within a light-emitting OLED device and or between adjacent light-emitting OLED devices in an array of OLED devices can be achieved in an easy, variable and reliable way. Furthermore pattern of non-emitting first areas fully enclosed by a light-emitting functional layers stack are obtainable, which is not possible with shadow-mask techniques. With the method according to the present invention, any connection between different first areas or between a first area and the rim around the light-emitting area of the OLED is not required to manufacture such non-emitting first areas. In an embodiment the structured pattern are designed to separate light-emitting second areas from each other by arranging first areas in between the second areas dividing the second areas, e.g. in an array of rectangular shaped second areas arranged in rows and columns with stripe like first areas in between on top of the substrate. The established array of functional layer stacks can be used to manufacture separate OLEDs defined by each of the separate second areas by mechanically cutting the substrate along the first areas. Before cutting the substrate along the first areas, the stack modification layer and all materials deposited on top of the stack modification layer might be removed by a suitable solvent to obtain non-covered first areas enabling an easier mechanical cutting of the substrate. Therefore the applied method to structure the functional layer stack without using shadow masks is variable and reliable and enables to use the same deposition processes for the functional layer stack as applied during mask processing. Therefore the method is easily applicable, because no changes of the deposition processes for the functional layers are required. Only one additional step outside any vacuum chamber to deposit the stack modification layer has to be added. This additional step does not influence the subsequent deposition steps to finalize the functional layer stack.

Suitable materials for the stack modification layers providing the described de-wetting effect are materials providing the de-wetting effect at least with respect to the metals used in the second electrode on top. The material of the stack modification layer preferably fulfills the following additional requirements:

Being sufficiently chemically inert with respect to the organic and inorganic substances used in the OLED functional stack (e.g. fluorinated or perfluorinated materials), having a low vapor pressure such that the substrate covered with the substance can be introduced in the vacuum deposition system without evaporating and contaminating the system (e.g. vacuum pump oils or vacuum greases), and/or having a suitable viscosity such that it can be applied in a contact printing method or a non-contact printing method like ink-jet printing to the OLED substrate In an embodiment the stack modification layer is made of at least one material of the group of vacuum greases comprising perfluorinated materials, referably PTFE TEC grease from Inland Vacuum Industries Churchville N.Y. 14428, Krytox greases from Du Pont or perfluorinated vacuum pump oils, preferably Fomblin Y grades from Solvay, Krytox fluids from Du Pont, perfluorinated Tyreno fluids from Klueber, more preferred Tyreno Fluid 12/25V.

The substrate of bottom emitters is made of a transparent material, e.g. glass or plastic. The term "transparent" denotes layers or materials, which major part (area) is transparent. In case of top emitters, the substrate can either be transparent or non-transparent, e.g. reflective. In case of transparent OLEDs the substrate is transparent. In case of transparent OLEDs or bottom-emitting OLEDs, the first electrode is made of indium-tin-oxide (ITO) commonly deposited on a glass substrate. Alternative suitable transparent conductive oxides are doped zinc oxide, tin oxide or poly(3,4-ethylenedioxythiophene)poly(styrenesulfonate), usually referred to as Pedot:PPS or similar polymers. For top-emitting OLEDs, the first electrode can be either transparent (in case of a reflective substrate, e.g. made of metal) or reflective. In case of a reflective first electrode (e.g. Aluminum), the substrate can be made of a transparent or non-transparent material. Suitable materials, layer parameters (e.g. layer thickness) and deposition conditions for substrates and first electrodes are known to skilled people. In a preferred embodiment, the OLED according to the present invention is a bottom-emitting OLED with transparent first electrode and transparent substrate in order to obtain transparent first areas as non-emitting areas. The corresponding method to manufacture the OLED provides a bottom-emitting OLED with transparent first areas as non-emitting areas using a transparent substrate and a transparent first electrode. The transparent first areas can be used for instance to either produce light effects in combination with differently colored backgrounds behind the transparent non-emitting first area or to display symbols or characters with enclosed first areas being as transparent as the outer areas around of these symbols or characters.

The organic electroluminescent device (OLED) may utilize organic small molecules or polymers to produce light, when a driving voltage of a few volts is applied to the electroluminescent layer stack via the top and bottom electrodes. Accordingly, OLEDs may be referred to as small molecule organic light emitting devices (SMOLEDs) or polymer light emitting devices (PLEDs). However, SMOLEDS are preferred because of their better light emission performance. The functional layer stack comprises at least two electrodes with the first (bottom) electrode typically as the anode and the second (top) electrode typically as the cathode and with an organic layer stack in between. In some embodiments, there might be a plurality of organic layers arranged between the electrodes within the organic layer stack, such as hole transport layer, electron transport layer, hole blocking layer, electron blocking layer, one or more light emitting layers, e.g. comprising a host material with embedded light emitting molecules. A large number of different organic layer stacks comprising a different number/type of layers is known to skilled people, which are able to choose a suitable electroluminescent layer stack in dependence on the desired application. Alternatively organic layer stacks may comprise only one organic light-emitting layer able to emit light.

The second (top) electrode is typically a metal layer made of aluminum with thicknesses of 20-150 nm. In case of bottom-emitters, the second electrode has a sufficient thickness to reflect the light back towards the substrate. In case of top-emitters the second electrode made of metal has a thickness below 20 nm providing a sufficient transparency to emit light through the second electrode. In an embodiment the material for the conductive layer as the second electrode is Aluminum or Silver providing a high reflectivity in case of thick layers and a sufficient transparency in case of thin layers while maintaining a good conductivity even for thin layers.

The layers of the functional layer stack might be deposited with any suitable deposition technique for preparing thin layers in the order of several tens to several hundreds of nanometers. Suitable techniques are sputtering, e.g. for depositing the first electrode, and thermal evaporation, e.g. for the organic layer stack and the second electrode.

The thickness of the stack modification layer covering the first areas could vary between 1-1000 micrometers. The stack modification layer can be applied by spraying, printing or painting processes or even manual with a tip, a paint-brush or a stamp. In an embodiment the deposition of the stack modification layer is executed by printing the stack modification layers according to the desired pattern on top of the first electrode. The printing process enables to provide first areas with desired pattern in a fast, variable, reliable, accurate and reproducible way. The printing process could be either a contact printing process or a non-contact printing process. With a non-contact printing process like ink-jet printing, the desired stack modification layer pattern can be varied from one substrate to the following substrate. A print process is a fast process, therefore local layers of stack modification layers can be deposited on a large number of substrates within a short time interval. In another embodiment the deposition of the organic layer stack and the deposition of the second electrode are executed in a vacuum chamber by applying thin film deposition techniques comprising evaporation, where the step of deposition of the stack modification layer is executed before the substrate enters the vacuum chamber. The common vacuum deposition steps don't have to be modified by applying the method according to the present invention. The deposition of the stack modification layer can be executed as a separate process step outside the vacuum chambers, therefore being a modular process step within OLED manufacturing. Therefore location and deposition time of the deposition step for the stack modification layer can be chosen appropriate to the manufacturing line and the available space and process time.

In the present invention, the term "conductive" always denotes an electrically conductive material or component, even if the term "electrically" is not used. The term "non-conductive" denotes materials or layers having a high resistance or high sheet resistance resulting in preventing any current flow through this material, which is not negligible for the operation of the OLED device and for generating light from the organic light-emitting layer.

In an embodiment a cover lid enclosing the functional layer stack is attached to the substrate after having finished the functional layer stack, previously the volume between functional layer stack and cover lid is at least partly filled with a second chemically inert liquid. The cover lid prevents moisture or oxygen penetrating into the organic light-emitting layer stack providing an OLED device with a sufficient lifetime. The cover lid might be made of any suitable rigid material providing a sufficient barrier against diffusion of moisture and/or oxygen into the encapsulated volume between cover lid and substrate. The cover lid can be attached (or sealed) to the substrate by applying a suitable sealing material being sufficiently gas tight, at least against moisture and oxygen, e.g. glass frit (non conductive material) or glue (e.g. epoxy glue) on top of the substrate followed by attaching the cover lid to this material. The term "attached to the substrate" denotes a tight connection between cover lid and substrate. In case of substrates with additional layers (e.g. contact pads for first and/or second electrodes) on top, the cover lid is attached to the substrate across theses layers. The cover lid has an inner and outer side, where the inner side denotes the side of the cover lid facing towards the functional layer stack. The outer side is correspondingly the other side of the cover lid. The shape of the cover lid is adapted to provide a gap between the inner side of the cover lid and the functional layer stack. The gap shall prevent any mechanical impact to the cover lid from the outside of the OLED device reaching the functional layer stack. A getter material might be arranged inside the gap, typically attached to the inner side of the cover lid. The gap (volume) between cover lid and the functional layer stack could have dimensions up to a few millimeters. The volume (gap) inside the cover lid is at least partly filled with a second chemically inert liquid to further improve the lifetime of the OLED by enhancing the robustness against environmental influences such as moisture and/or oxygen. Alternatively the volume might be filled with dry gases, e.g. dry nitrogen. The second substance can be the same substance as the stack modification layer used to be deposited on top of the first electrode. However, the second substance should be non-conductive.

In another embodiment a removal step after having deposited the second electrode is applied to remove the stack modification layer and the organic layer stack on top of the stack modification layer from the first areas using a solvent being sufficiently chemical inert to the organic layer stack not to attack the organic layer stack on top of the second areas. The removal step leads to OLED devices having lifetimes identical to OLED devices, where no stack modification layer is deposited within the functional layer stack. Even in case of the use of sufficiently chemical inert materials for the stack modification layer, any effect on the lifetime can be prevented by removing the stack modification layer after finishing the functional layer stack. Additionally after the execution of the removal step the first electrode is not covered by any material within the first areas enabling an electrical contacting of the first electrode via the first areas from the side of the OLED or from the backside of the functional layer stack depending on the location and shape of the first areas. Furthermore non-coated first areas might be used to attach additional components to the OLED, e.g. a cover lid to encapsulate the functional layer stack.

In a preferred embodiment the solvent is a fluorinated liquid material, preferably 3M fluorinated liquid, more preferably FC-43 or FC-87, to exclude any negative lifetime effect due to the use of solvents. The material of the stack modification layer is soluble in those solvents, which do not attack the organic and inorganic materials used in the OLEDs functional stack. This allows a removal of the substance such that additional production steps like encapsulation of the OLED can be performed without problems.

In another embodiment the removal step is followed by a cleaning step applying e.g. an oxygen plasma (either low-pressure or at ambient pressure) to the second electrode, preferably limited to the first areas. The oxygen plasma treatment decreases the risk of shorts originating from sharp of the functional layer stack around the first areas. The cleaning step as well as the removal step can be executed outside any vacuum chamber after finishing the functional layer stack.

In another embodiment after having finished the functional layer stack, the functional layer stack is enclosed by a glued-on lid or with a thin film encapsulation. The application of such lids requires the previous removal of the stack modification layer. Glued-on lids or thin film encapsulation enable to manufacture thin OLEDs, which also could be flexible in case of thin film encapsulation.

The invention further relates to an organic electroluminescent light-emitting device with structured pattern of light-emitting and non-emitting areas comprising a substrate coated at least locally with at least one conductive layer as a first electrode with first areas on top of the first electrode covered with a stack modification layer forming the desired structured pattern and second areas on top of the first electrode adjacent to the first areas non-covered by the stack modification layer, an organic layer stack with at least one organic light-emitting layer deposited on top of the first electrode resulting in first areas of the organic layer stack separated from the first electrode by the stack modification layer in between the organic layer stack and the first electrode and in second areas being in direct electrical contract to the first electrode, and a second electrode on top of the organic layer stack to finish a functional layer stack, wherein the stack modification layer covering the first areas prevent the organic layer stack within the first areas from being covered with the second electrode without applying any shadow mask technique, while the second electrode still covers the organic layer stack on top of the second areas. Such OLED can be commonly operated within the second areas leading to light-emitting second areas, while the first areas do not emit light. Depending on the used materials for substrate and first electrode, the first areas can be transparent or non-transparent. In an embodiment the stack modification layer is made of at least one material of the group of vacuum greases comprising perfluorinated materials, referably PTFE TEC grease from Inland Vacuum Industries Churchville N.Y. 14428, Krytox greases from Du Pont or perfluorinated vacuum pump oils, preferably Fomblin Y grades from Solvay, Krytox fluids from Du Pont, perfluorinated Tyreno fluids from Klueber, more preferred Tyreno Fluid 12/25V.

In another embodiment a cover lid is attached to the substrate enclosing the functional layer stack, where volume between functional layer stack and cover lid is at least partly filled with a second chemically inert liquid. This will further improve the lifetime stability of the OLED device.

The invention further relates to another organic electroluminescent light-emitting device with structured pattern of light-emitting second areas and non-emitting first areas comprising a substrate coated with a conductive layer as a first electrode, an organic layer stack with at least one organic light-emitting layer on top of the second areas and a second electrode on top of the organic layer stack to finish a functional layer stack, wherein the non-covered first areas are prepared by the method according to present invention comprising a removal step to remove the stack modification layer, preferably also cleaned by applying a cleaning step in accordance to the present invention, wherein the functional layer stack is enclosed by a cover lid attached to the substrate, where a volume between functional layer stack and cover lid is at least partly filled with a second chemically inert liquid, or is enclosed by a glued-on lid or by a thin film encapsulation.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
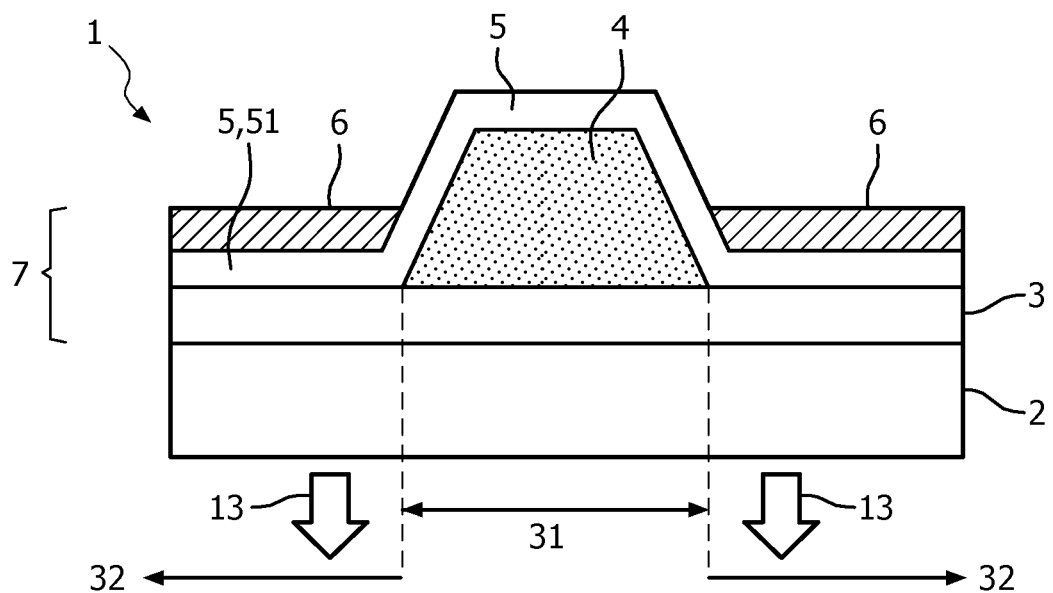
FIG. 1: one embodiment of an OLED device according to the present invention in a side view.

FIG. 1 shows one embodiment of an OLED device 1 according to the present invention in a side view with structured pattern of non-emitting and light-emitting areas 31, 32 comprising a substrate 2 coated at least partly with a conductive layer as a first electrode 3. The first electrode 3 comprises first areas 31 covered with a stack modification layer 4 and second areas 32 on top of the first electrode 3 adjacent to the first areas 31 not covered by the stack modification layer 4 forming the desired structured pattern as indicated by the arrows. The organic layer stack 5 comprising at least one organic light-emitting layer 51 is deposited on top of the first electrode 3 covering the first and second areas of the first electrode covered or non-covered with the stack modification layer 4. The deposited stack modification layer 4 within the shown first area 31 leads to an organic layer stack 5 being separated from the first electrode 3 in the first area 31 and being in direct electrical contract to the first electrode 3 in the second area 32. The second electrode 6 is deposited on top of the organic layer stack 5 to finish a functional layer stack 7, wherein the stack modification layer 4 covering the first areas 31 surprisingly prevents the organic layer stack 5 within the first areas 31 from being covered with the second electrode 6 without applying any shadow mask technique, while the second electrode 6 still covers the organic layer stack 5 on top of the second areas 32. To obtain a non-emitting first area, no additional removal steps to remove the second electrode in the first area or mask processes to prevent deposition of the second electrode with in the first area are required. In this embodiment, the light 13 generated within the organic light-emitting layer 51 is out-coupled to the environment through the transparent first electrode 3, e.g. made of ITO, and the transparent substrate 2, e.g. made of glass or plastic. The organic layer stack may comprise common layers known to skilled people. These layers are deposited for example by thermal evaporation. The material of the second electrode might be Aluminum or Copper. In this embodiment the material of the stack modification layer is sufficiently chemically inert with respect to the organic and inorganic substances used in the OLED functional stack (e.g. fluorinated or perfluorinated materials), has a low vapor pressure such that the substrate covered with the substance can be introduced in the vacuum deposition system without evaporating and contaminating the system (e.g. vacuum pump oils or vacuum greases), and has a suitable viscosity such that it can be applied in a contact printing method or a non-contact printing method like ink-jet printing to the OLED substrate. As an example the material of the stack modification layer one material of the group of vacuum greases comprising perfluorinated materials, referably PTFE TEC grease from Inland Vacuum Industries Churchville N.Y. 14428, Krytox greases from Du Pont or perfluorinated vacuum pump oils, preferably Fomblin Y grades from Solvay, Krytox fluids from Du Pont, perfluorinated Tyreno fluids from Klueber, more preferred Tyreno Fluid 12/25V.

Figure 2:
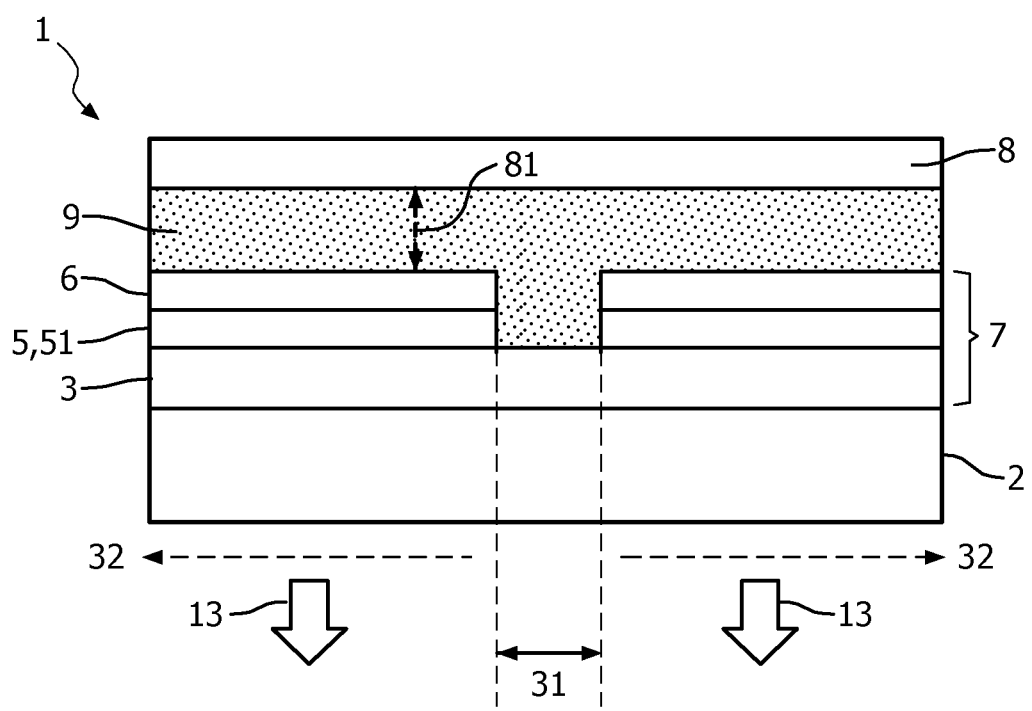
FIG. 2: another embodiment of the OLED device according to the present invention in a side view comprising a cover lid.

FIG. 2 shows another embodiment of the OLED device 1 according to the present invention in a side view comprising a cover lid 8. The OLED device 1 also comprises structured pattern of light-emitting second areas 32 and non-emitting first areas 31, where a substrate 2 is coated with a conductive layer as a first electrode 3, an organic layer stack 5 with at least one organic light-emitting layer 51 on top of the second areas 32 and a second electrode 6 on top of the organic layer stack 5 to finish a functional layer stack 7, wherein the non-covered first areas 31 are prepared by the method according to present invention by depositing the stack modification layer obtaining the structured second electrode 6 as described before followed by a removal step to remove the stack modification layer 4 together with the organic layer stack 5 on top of the stack modification layer 4 using a solvent 10 being sufficiently chemical inert to the organic layer stack 5 not to attack the organic layer stack 5 on top of the second areas 32. Since the stack modification layer 4 is already removed in FIG. 2, both stack modification layer 4 and solvent 10 cannot be shown here. A suitable solvent 10 to remove the stack modification layer 4 is a fluorinated liquid material, e.g. a 3M fluorinated liquid such as FC-43 or FC-87. The OLED device, especially the first areas might be cleaned (C) by applying oxygen plasma before encapsulating the functional layer stack 7. To finish the OLED device 1 the functional layer stack 7 is enclosed by a cover lid 8 attached to the substrate 2 (not shown in details here), where a volume 81 between functional layer stack 7 and cover lid 8 is filled with a second chemically inert liquid 9. The second chemically inert liquid 9 should be non-conductive and might by a material also used for the stack modification layer 4. The gap (volume) 81 between cover lid 8 and the functional layer stack 7 could have dimensions up to a few millimeters. The second chemically inert liquid 9 ensures a sufficient lifetime of the OLED device 1 by enhancing the robustness against environmental influences such as moisture and/or oxygen. Alternatively the volume 81 might be filled with dry gases, e.g. dry nitrogen. In this embodiment, the OLED device 1 is a bottom emitter with light emission 13 through the transparent first electrode 3 and the transparent substrate 2.

Figure 3:
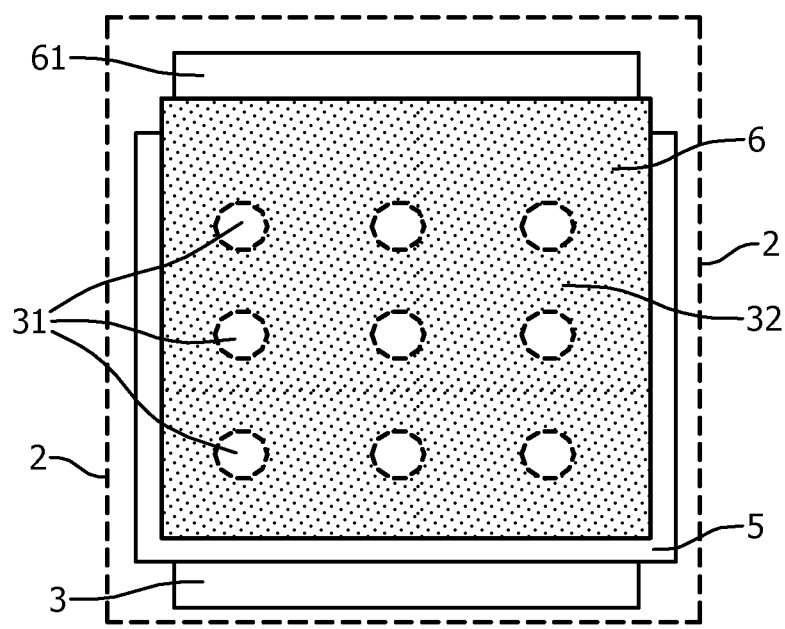
FIG. 3: another embodiment of an OLED device according to the present invention in a top view.

FIG. 3 shows a top view of another embodiment of an OLED device according to the present invention before enclosing the function layer stack by cover lid, glue-on lid or a thin film encapsulation. As shown in FIG. 2, the stack modification layer 4 is already removed by the previously described method steps. The pattern of first areas 31 (non-emitting areas) and second areas 32 (light-emitting areas) consist of circular first areas 31 embedded within light-emitting second areas 32. The first areas 31 are fully enclosed by the second areas 23. Such a pattern of non-emitting and light-emitting areas 31, 32 is not obtainable with a shadow mask. When a shadow mask would be applied, at least small corridors of non-emitting areas will connect the first areas 31 to the non-coated rim around the functional layer stack 7 comprising layer (stack) 3, 5, 6. The first electrode 3 can be electrically connected to a power supply by attaching an electrical contact to the non-covered area at the bottom of FIG. 3. The second electrode can be connected to the power supply by attaching an electrical contact to the non-covered area 61, the so-called contact pad, being in electrical contact to the second electrode 6.

Figure 4:
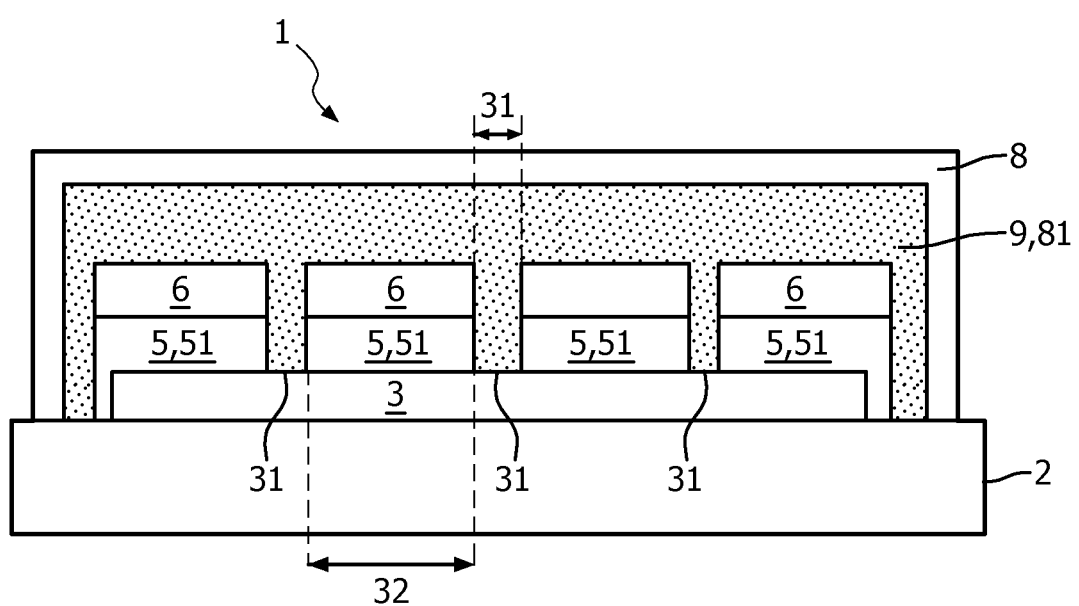
FIG. 4: another embodiment of an OLED device according to the present invention in a top view.

FIG. 4 shows another embodiment of an OLED device according to the present invention in a top view. The pattern are strip-like pattern of light-emitting second areas 32 covered with organic layer stack 5 comprising the organic light-emitting layer 51 and the second electrode 6. The stack modification layer 4 deposited on top of the first areas 31 is removed as described above. After the removal, a cover lid 8 is attached to the substrate 2, e.g. glued on top of the substrate 2. Common electrical feedthroughs can be used to apply an operation voltage to the functional layer stack after enclosing it by the cover lid 8.

Figure 5:
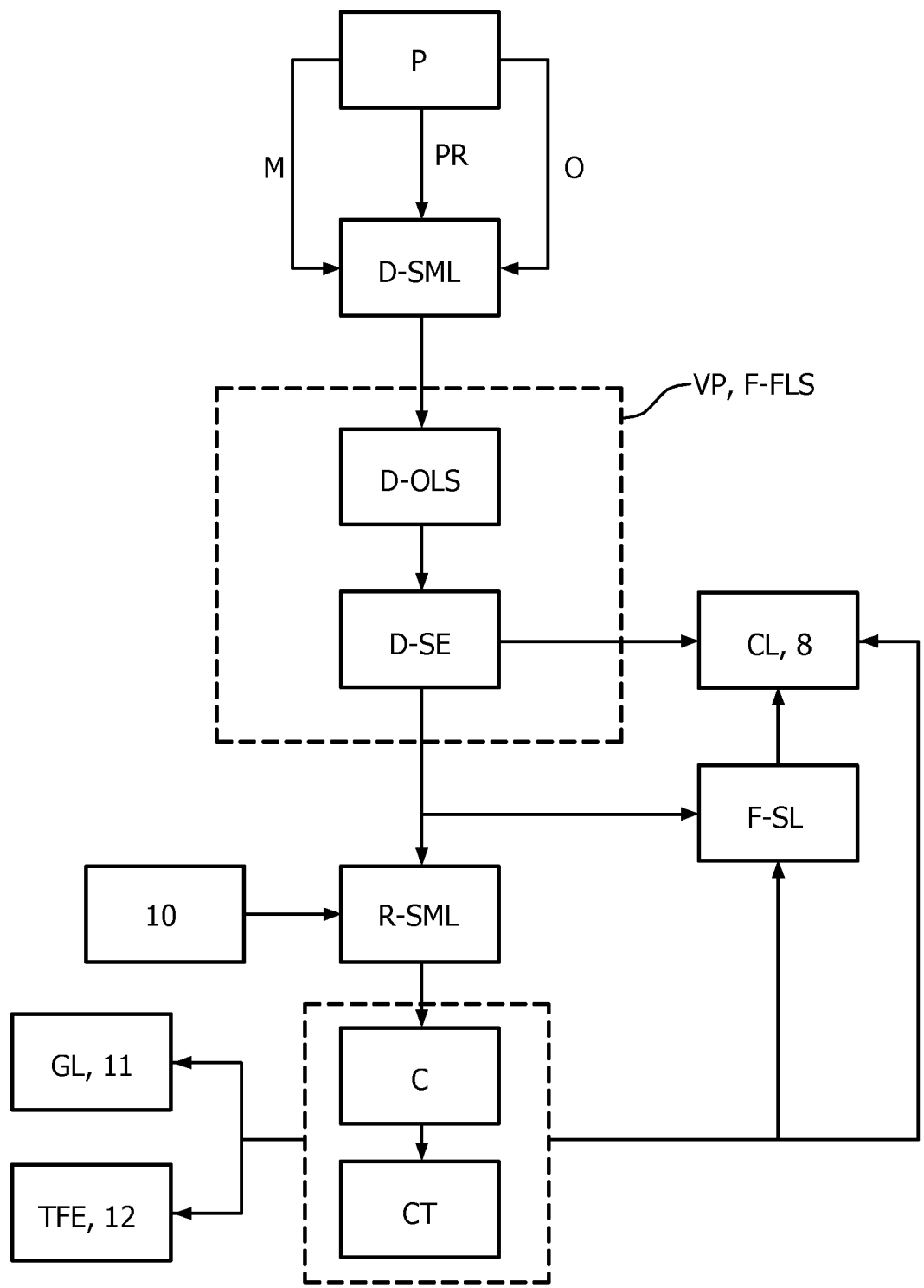
FIG. 5: one embodiment of the method steps for manufacturing OLED devices according to the present invention

FIG. 5 shows one embodiment of the method steps for manufacturing OLED devices 1 according to the present invention. The method comprises the providing P of a substrate 2 covered at least locally with at least one conductive layer as the first electrode 3 followed by depositing D-SML a stack modification layer 4 locally on top of the first electrode 3 to establish first areas 31 covered with the stack modification layer 4 and non-covered second areas 32 adjacent to the first areas 31 forming the desired structured pattern. The deposition D-SML of the stack modification layer 4 is preferably executed by printing PR the desired pattern on top of the first electrode 3. Alternatively, the stack modification layer might be deposited manually M or using other local deposition techniques O. This step can be executed in a common environment. The resulting substrate 2 carrying the first and second areas 31, 32 forming the desired structured pattern now enters a vacuum chamber to apply the subsequent vacuum processes VP to deposit the next layers (indicated as dashed process area). The organic layer stack 5 comprising at least one organic light-emitting layer 51 is deposited D-OLS on top of the first electrode 3 being locally coated with the stack modification layer 4 by thermal evaporation resulting in an organic layer stack 5 being separated from the first electrode 3 by the stack modification layer 4 in between the organic layer stack 5 and the first electrode 3 in the first areas 31 and being in direct electrical contract to the first electrode 3 in the second areas 32 followed by depositing D-SE of a conductive metal layer as the second electrode 6 on top of the organic layer stack 5 to finish F-FLS a functional layer stack 7, wherein the first areas 31 above the stack modification layer 4 remain free of the conductive metal without masking these first areas 31. The OLED device 1 with the finished functional layer stack F-FLS comprising the desired structured pattern leaves the vacuum chamber VP. Depending on the desired enclosure of the functional layer stack or depending on the eventually desired cutting of the substrate in smaller parts, different process steps will be applied in addition to the previous steps. In principal, the finished functional layer stack can be enclosed CL by a common cover lid 8. In a preferred manufacturing process, the volume 81 between cover lid 8 and functional layer stack 7 can be at least partly filled F-SL with a second chemically inert liquid 9 to further enhance the robustness of the OLED device 1 against environmental effects. Alternatively or additionally a removal step R-SML can be applied to remove the stack modification layer 4 and the organic layer stack 5 on top of the stack modification layer 4 from the first areas 31 using a solvent 10 being sufficiently chemical inert to the organic layer stack 5 not to attack the organic layer stack 5 on top of the second areas 32. The solvent 10 might be a fluorinated liquid material, preferably 3M fluorinated liquid, more preferably FC-43 or FC-87, to exclude any negative lifetime effect due to the use of solvents. During the removal step R-SML, the complete functional layer stack 7 might be wetted with the solvent 10. Alternatively the solvent 10 might be sprayed on top of the functional layer stack 7. However, the solvent 10 has to be applied carefully not to mechanically damage the functional layer stack 7. After the removal step R-SML a cleaning step C is performed by applying oxygen plasma to the second electrode 6, which is preferably limited to the first areas 31. Here, low $O_2$-pressure or environmental $O_2$-pressure might be applied for $O_2$ plasma etching. After the removal step R-SML followed optionally by the cleaning step C the OLED device 1 is ready for being enclosed. In case of a batch production of OLED devices 1, the structured pattern are designed to separate light-emitting second areas 32 from each other by arranging first areas 31 in between the second areas 32 dividing the second areas 32 on top of the substrate 2 allowing a cutting CT of the substrate 2 along the first areas 31, preferably the second areas 32 are arranged in an array of rectangular shaped second areas 32 arranged in rows and columns with stripe like first areas 31 in between. Here the OLED devices 1 to be enclosed with a cover lid have to be separated from each other by the cutting step CT cutting the substrate along the first areas. The resulting OLED substrates are sub-areas of the previous large single substrate used for batch production of several OLEDs in one deposition process. After obtaining the separated OLED devices 1, the further method steps to enclose the OLED device 1 are the same with or without such a cutting step CT. The functional layer stack 7 might be enclosed GL, TFE by a glued-on lid 11 or with a thin film encapsulation 12 or with a common cover lid 8 optionally filling the volume 81 between cover lid 8 and functional layer stack 7 with the second chemically inert liquid 9.

The following examples are manufacture by applying at least several of the previously described method steps:

Example 1

Substrate Glass with ITO 150 nm on Top

Stack modification layer: Tyreno fluid (vacuum pump oil) applied manually with a paint-brush.

Organic layer stack: deposition of hole injector, hole transport layer, emitter layer, hole blocking layer and electron transport layer on top of substrate. Then LiF and Aluminum evaporated, common evaporation process.

Second electrode: Aluminum covers the second areas but does not attach to this film when there is a stack modification layer underneath as present within the first areas. Removal step: with FC-43 (washing) as the solvent, removes all visible traces of oil Cleaning step: Additional $O_2$ plasma cleaning (see below)

Example 2

Stack Modification Layer: TEC Grease

Removal step: with FC-43 as the solvent, washing with FC-43 dissolved the oil or the grease and allows removing the parts of the organic layers on top of the stack modification layer.

Cleaning step: $O_2$ plasma cleaning (Diener electronics plasma processor "Nano") removes last traces of stack modification layer or solvent. Cover lids can be applied by glue.

The not mentioned layers are the same as listed in example 1.

Figure 6:
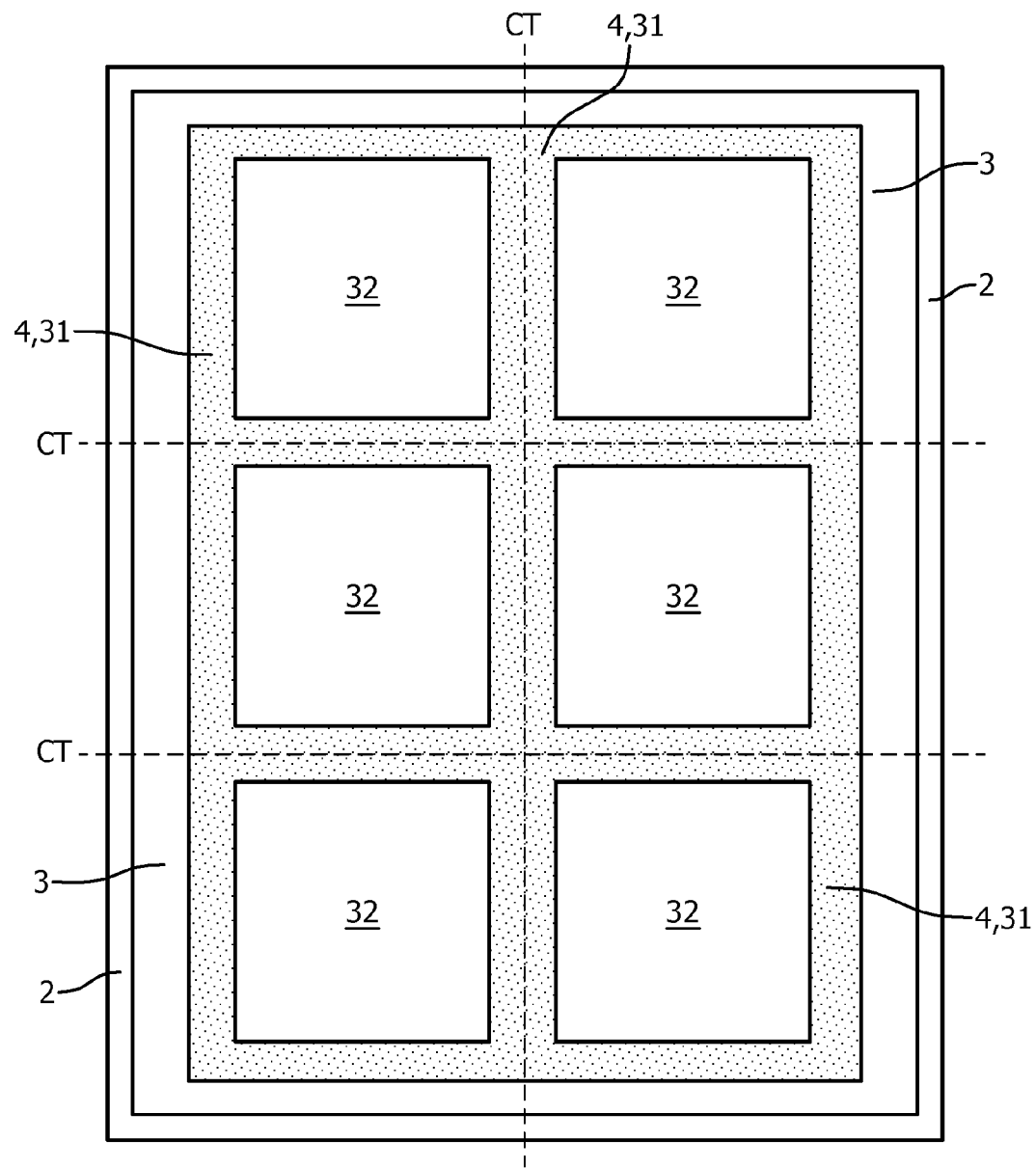
FIG. 6: one embodiment of the method steps for manufacturing OLED devices according to the present invention out of an array of second areas by cutting the substrate along the first areas.

FIG. 6 shows one embodiment of the method steps for manufacturing OLED devices 1 according to the present invention out of an array of second areas 32 by cutting CT the substrate 2 along the first areas 31 (as indicated by the dashed lines CT). The second areas 32 are arranged in an array of rectangular shaped second areas 32 arranged in rows and columns with stripe like first areas 31 in between. The structured pattern are designed to separate light-emitting second areas 32 from each other by arranging first areas 31 in between the second areas 32 dividing the second areas 32 on top of the substrate 2 allowing a mechanical cutting CT, e.g. sawing, of the substrate 2 along the first areas 31. For ease of understanding the other layers of the functional layer stack 7 are not shown in FIG. 6. However, the functional layer stack is finished at least on top of the light-emitting second areas 32.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

LIST OF NUMERALS

1 OLED device (organic electroluminescent light-emitting device) according to the present invention
2 substrate
3 first electrode
31 first area of the first electrode
32 second area of the first electrode
4 stack modification layer deposited on top of the first electrode
5 organic layer stack
51 organic light emitting layer
6 second electrode
61 contact pad for the second electrode
7 functional layer stack
8 cover lid
81 volume between cover lid and functional layer stack
9 second chemically inert liquid
10 solvent
11 glued-on lid
12 thin film encapsulation
13 emitted light
C cleaning step
CL attaching a cover lid to the substrate to enclose the functional layer stack
CT cutting of the substrate along the first areas/cutting line
D-OLS Depositing the organic layer stack on top of the first electrode or stack modification layer
D-SE Depositing the second electrode on top of the organic layer stack
D-SML Depositing a stack modification layer on top of the first electrode
F-FLS finishing the functional layer stack
F-SL filling the cover lid at least partly with a second chemically inert liquid
GL enclosing the functional layer stack by a glued-on lid
M depositing the stack modification layer manually
O applying other technologies to deposit the stack modification layer
P Providing substrate with first electrode
PR Printing the stack modification layer
R-SML removing the stack modification layer (removal step)
TFE enclosing the functional layer stack by a thin film encapsulation
VP applying thin film deposition techniques in a vacuum chamber

The invention claimed is:
1. An organic electroluminescent light-emitting device with a structured pattern of non-emitting and light-emitting areas, the device comprising:
   a substrate coated at least locally with at least one conductive layer as a first electrode;

a stack modification layer on top of the first electrode, the stack modification layer covering first areas and leaving non-covered second areas adjacent to the first areas thereby forming the structured pattern, the stack modification layer being a layer that comprises at least one of a perfluorinated vacuum grease or a perfluorinated vacuum pump oil;

an organic layer stack with at least one organic light-emitting layer deposited on top of the first electrode and the stack modification layer, wherein first areas of the organic layer stack are separated from the first electrode by the stack modification layer and second areas of the organic layer stack are in direct electrical contact with the first electrode; and a second electrode on top of the organic layer stack, wherein said second electrode finishes a functional layer stack.

2. The organic electroluminescent light-emitting device according to claim 1, further comprising a cover lid attached to the substrate enclosing the functional layer stack, wherein volume between the functional layer stack and the cover lid is at least partly filled with a chemically inert liquid.

3. A method for manufacturing an organic electroluminescent light-emitting device with a structured pattern of light-emitting and non-emitting areas comprising the steps of:

providing a substrate covered at least locally with at least one conductive layer as a first electrode;

depositing a stack modification layer locally on top of the first electrode to establish first areas covered with the stack modification layer and non-covered second areas adjacent to the first areas forming the structured pattern, the stack modification layer being a layer that comprises at least one of a perfluorinated vacuum grease or a perfluorinated vacuum pump oil;

depositing an organic layer stack comprising at least one organic light-emitting layer on top of the first electrode locally coated with the stack modification layer such that the organic layer stack is separated from the first electrode by the stack modification layer in between the organic layer stack and the first electrode in the first areas and is in direct electrical contact with the first electrode in the second areas; and depositing a conductive metal layer as a second electrode on top of the organic layer stack to finish a functional layer stack.

4. The method according to claim 1, wherein the depositing of the stack modification layer is executed by ink-jet printing according to the structured pattern on top of the first electrode.

5. The method according to claim 3, wherein the structured pattern is designed to separate the second areas from each other by arranging the first areas in between the second areas such that the first areas divide the second areas on top of the substrate to permit a cutting of the substrate along the first areas.

6. The method according to claim 3, wherein the depositing of the organic layer stack and the depositing of the second electrode are executed in a vacuum chamber by applying thin film deposition techniques comprising evaporation, wherein the depositing of the stack modification layer is executed before the substrate enters the vacuum chamber.

7. The method according to claim 3, wherein the material for the conductive layer as the second electrode is Aluminum or Silver.

8. The method according to claim 7, further comprising attaching, after having finished the functional layer stack, a cover lid enclosing the functional layer stack on the substrate, wherein, prior to said attaching, the volume between the functional layer stack and the cover lid is at least partly filled with a chemically inert liquid, the chemically inert liquid being a material that is also included in the stack modification layer.

9. The method according to claim 3, further comprising removing, after depositing the conductive metal layer as the second electrode, the stack modification layer and the organic layer stack on top of the stack modification layer from the first areas using a solvent being sufficiently chemical inert to the organic layer stack so as to not attack the organic layer stack on top of the second areas, the solvent being a fluorinated liquid material.

10. The method according to claim 9, further comprising cleaning by applying an oxygen plasma to the second electrode.

11. The method according to claim 9, wherein after having finished the functional layer stack, the functional layer stack is enclosed by a glued-on lid or with a thin film encapsulation.

* * * * *